United States Patent
Wu et al.

(10) Patent No.: US 9,484,417 B1
(45) Date of Patent: Nov. 1, 2016

(54) METHODS OF FORMING DOPED TRANSITION REGIONS OF TRANSISTOR STRUCTURES

(71) Applicant: GLOBALFOUNDRIES Inc., Grand Cayman (KY)

(72) Inventors: Xusheng Wu, Ballston Lake, NY (US); Manfred Eller, Beacon, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/805,907

(22) Filed: Jul. 22, 2015

(51) Int. Cl.
  *H01L 29/167* (2006.01)
  *H01L 29/161* (2006.01)
  *H01L 29/78* (2006.01)
  *H01L 29/417* (2006.01)
  *H01L 29/66* (2006.01)

(52) U.S. Cl.
  CPC ........... *H01L 29/167* (2013.01); *H01L 29/161* (2013.01); *H01L 29/4175* (2013.01); *H01L 29/66477* (2013.01); *H01L 29/78* (2013.01)

(58) Field of Classification Search
  CPC ........... H01L 29/1041; H01L 29/1045; H01L 29/10545; H01L 29/167; H01L 21/041; H01L 21/0455; H01L 21/22; H01L 21/2822
  See application file for complete search history.

(56) References Cited

U.S. PATENT DOCUMENTS

| | | | | |
|---|---|---|---|---|
| 5,675,166 A | * | 10/1997 | Ilderem | H01L 29/0847 257/345 |
| 6,855,984 B1 | * | 2/2005 | Wu | H01L 21/823807 257/335 |
| 2003/0155618 A1 | * | 8/2003 | Boissonnet | H01L 27/088 257/369 |
| 2005/0088895 A1 | * | 4/2005 | Manger | H01L 27/10867 365/222 |
| 2006/0133754 A1 | * | 6/2006 | Patel | G02B 6/122 385/129 |
| 2010/0171543 A1 | * | 7/2010 | Korec | H01L 23/49524 327/436 |
| 2012/0153387 A1 | * | 6/2012 | Murthy | H01L 21/28512 257/335 |
| 2015/0162444 A1 | * | 6/2015 | Zhao | H01L 29/7842 257/327 |

* cited by examiner

*Primary Examiner* — Mohsen Ahmadi
(74) *Attorney, Agent, or Firm* — Heslin Rothenberg Farley and Mesiti PC; Nicholas Mesiti (57) ABSTRACT

Methods of forming doped transition regions of transistor structures are provided herein. The methods include, for instance: providing a first semiconductor material including a dopant over a source/drain region of the transistor structure; providing a second semiconductor material including the dopant over the first semiconductor material, where the second semiconductor material is different from the first semiconductor material; and, where providing the second semiconductor material is performed at a temperature sufficient to diffuse the dopant from the first semiconductor material through the source/drain region into a portion of a channel region of the transistor structure. The portion of the channel region into which the dopant from the first semiconductor material diffuses forms the doped transition region.

14 Claims, 9 Drawing Sheets

METHODS OF FORMING DOPED TRANSITION REGIONS OF TRANSISTOR STRUCTURES

FIELD OF THE INVENTION

The present invention generally relates to fabricating transistor structures, and more specifically to methods of forming doped transition regions between source/drain regions and channel regions of transistor structures.

BACKGROUND

Many types of circuit structures, such as silicon-on-insulator (SOI) structures, include transistor structures with source/drain (S/D) regions outside a gate structure and a channel region below or inside the gate structure. While source/drain regions often include doped semiconductor materials, channel regions generally remain undoped, thus a doped transition region between S/D regions and channel regions is frequently needed in order to lower resistance to electrical carrier flow between the S/D regions and channel regions. However, such doped transition regions ideally do not extend far below the transistor gate structure, so as to reduce undesirable short-channel effects. Controlling the formation of doped transitions regions of transistor structures to balance these issues remains challenging.

SUMMARY OF THE INVENTION

Various shortcomings of the prior art are overcome, and additional advantages are provided through the provision, in one aspect, of a method for forming a doped transition region between a source/drain (S/D) region of a transistor structure and a channel region of the transistor structure, the forming including: providing a first semiconductor material including a dopant over the source/drain region; providing a second semiconductor material including the dopant over the first semiconductor material, the second semiconductor material being different from the first semiconductor material; wherein providing the second semiconductor material is performed at a temperature sufficient to diffuse the dopant from the first semiconductor material through the source/drain region into a portion of a channel region of the transistor structure, the portion of the channel region being the doped transition region.

In another aspect, also provided is a structure including a transistor structure, the transistor structure including a transistor structure that includes a source/drain region, the source/drain region including: a first semiconductor material including a dopant; a second semiconductor material including the dopant, the second semiconductor material being different from the first semiconductor material; a channel region; and a doped transition region between the channel region and the source/drain region, wherein the doped transition region includes the dopant, the dopant having been diffused from the first semiconductor material into the doped transition region.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Reference is made below to the drawings, which are not drawn to scale for ease of understanding, wherein the same reference numbers used throughout different figures designate the same or similar components.

Figure 1A:
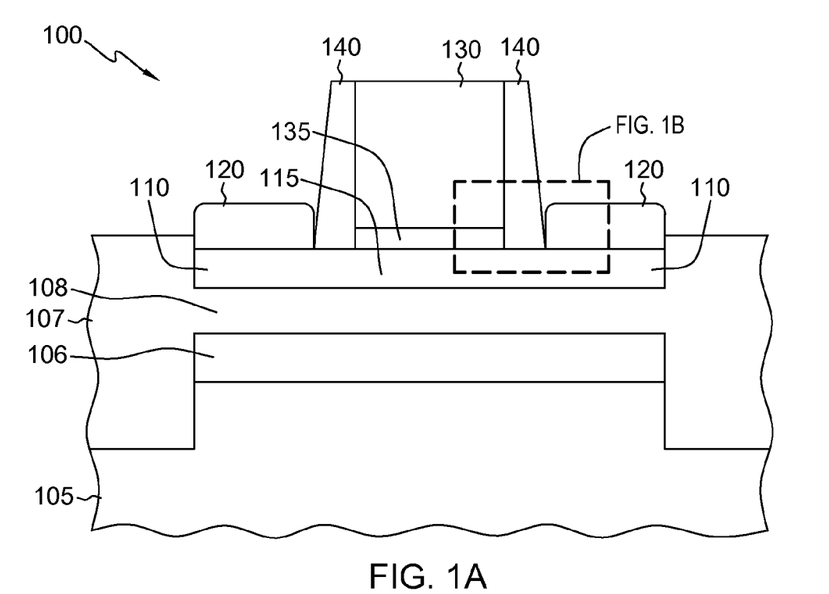
FIGS. 1A-1B depict formation of a transition region of a transistor structure, highlighting issues which are to be addressed by one or more aspects of the present invention.

FIG. 1A depicts a structure 100 including a transistor structure. Structure 100 may include, for example, a silicon-on-insulator (SOI) transistor structure, as illustrated in the example of FIG. 1A. Structure 100 may include, for example, a semiconductor substrate 105 having a back-plane portion 106 underlying a semiconductor layer 110, 115 of a transistor structure. Structure 100 may also include an insulating layer 108 underlying semiconductor layer 110, 115, and isolation regions 107 electrically isolating the transistor structure from other structure features, such as other transistors. The transistor structure may include a source/drain region 110 and a channel region 115, as well as raised source/drain region 120 over source/drain region 110. Channel region 115 may include a semiconductor channel material, and may be disposed below a gate structure of the transistor structure, the gate structure including gate materials 130, 135 and sidewalls 140 around gate materials 130, 135. Sidewalls 140 may include an electrically insulating material. Source/drain region 110 and channel region 115 may include a semiconductor material, such as silicon, germanium, or silicon-germanium (SiGe), and raised source/drain region 120 may include a doped semiconductor material, such as doped silicon-germanium or doped silicon-carbon. Raised source/drain region 120 may be formed, for example, by epitaxial deposition or growth of doped silicon-germanium or doped silicon-carbon. Silicon germanium may be doped with boron if the transistor structure is a p-type transistor, or silicon-carbon may be doped with phosphorous if the transistor is an n-type transistor. Either silicon-germanium or silicon-carbon may be doped with other p-type or n-type dopants, and other semiconductor materials may also be used for formation of raised source/drain regions. Boron-doped silicon-germanium may be ideal, in one example, because boron may remain well-confined within a lattice structure of silicon-germanium at low temperatures, such as 500° C. or less. Similarly, phosphorous-doped silicon-carbon may be ideal, in another example, because phosphorous may remain well-confined within a lattice structure of silicon-carbon at low temperatures, such as 500° C. or less.

Figure 1B:
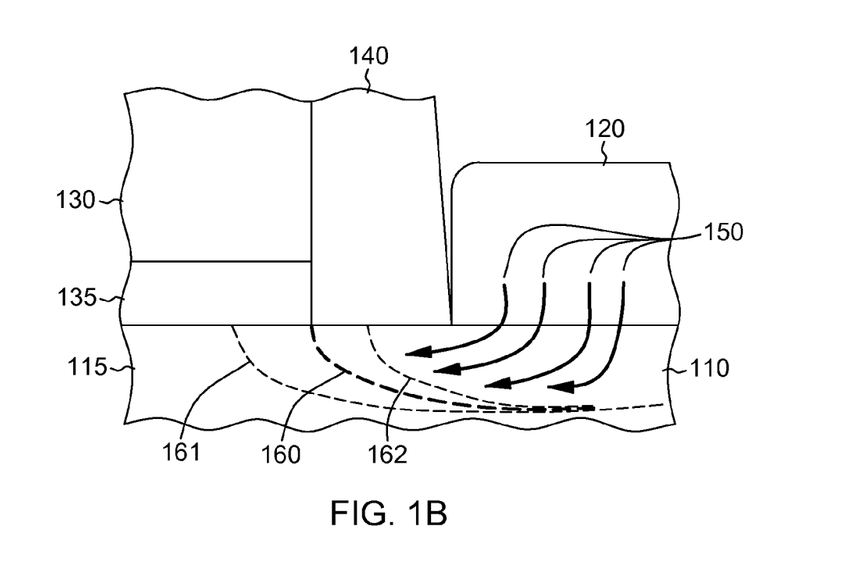

FIG. 1B depicts a portion of structure 100 from FIG. 1A, showing a portion of a process for formation of a transition region between source/drain region 110 and channel region 115. Formation of a transition region, such as a doped transition region, may be important for optimizing performance of the transistor structure. A transition region may be formed, for example, by thermally treating the transistor structure so that the dopant in raised source/drain region 120 diffuses through source/drain region 110 and into a portion of channel region 115. Thermally treating the transistor structure may be accomplished by a driving anneal process at temperatures of about 700° C. or greater. Ideally, dopant may diffuse 150 from raised source/drain region 120 to a depth 160 within channel region 115 near the transition between sidewall 140 and gate materials 130, 135. At such a diffusion depth, electrically resistance to carrier flow may be reduced without introducing undesirable short-channel effects in the transistor. Diffusion 150 of dopant to a greater depth 161 of channel region 115 far into channel region 115 and below gate materials 130, 135 may introduce undesirable short-channel effects to the transistor, which may degrade transistor performance. On the other hand, diffusion 150 of dopant to a shorter depth 162 of channel region 115 may result in high resistance to electrical carrier flow, which may degrade transistor performance.

Controlling the diffusion depth of dopant from raised source/drain region to an optimal depth, such as illustrated in FIG. 1B, may be difficult to control for both n-type and p-type transistors of a circuit structure because of the different diffusion rates at which different p-type and n-type dopants diffuse out of the semiconductor materials of raised source/drain regions. For example, a dopant such as phosphorous may have a diffusion coefficient that allows the dopant to readily diffuse out of silicon-carbide under thermal treatment at about 700°-800° C. However, a dopant such as boron may have a lower diffusion coefficient, and thus may not diffuse out of silicon-germanium readily at such temperatures. Boron may diffuse out of silicon-germanium at temperatures of about 1000° C. or more, but at such high temperatures phosphorous will diffuse further, and more rapidly, out of silicon-carbon. Thus, it may be difficult to control dopant diffusion depth for both p-type and n-type transistors within a single process step or in multiple process steps, which may result in some transistors having insufficient transition regions and/or other transistors having transition regions that are too large, resulting potentially in higher electrical resistance and/or greater short-channel effects in a circuit structure.

Thus, provided herein, in one aspect, is a method of forming a doped transition region between a source/drain (S/D) region of a transistor structure and a channel region of the transistor structure. The forming includes providing a first semiconductor material including a dopant over the source/drain region and providing a second semiconductor material including the dopant over the first semiconductor material, where the second semiconductor material is different from the first semiconductor material. Providing the second semiconductor material is performed at a temperature sufficient to diffuse the dopant from the first semiconductor material through the source/drain region into a portion of a channel region of the transistor structure, the portion of the channel region becoming the doped transition region.

Figure 2A:
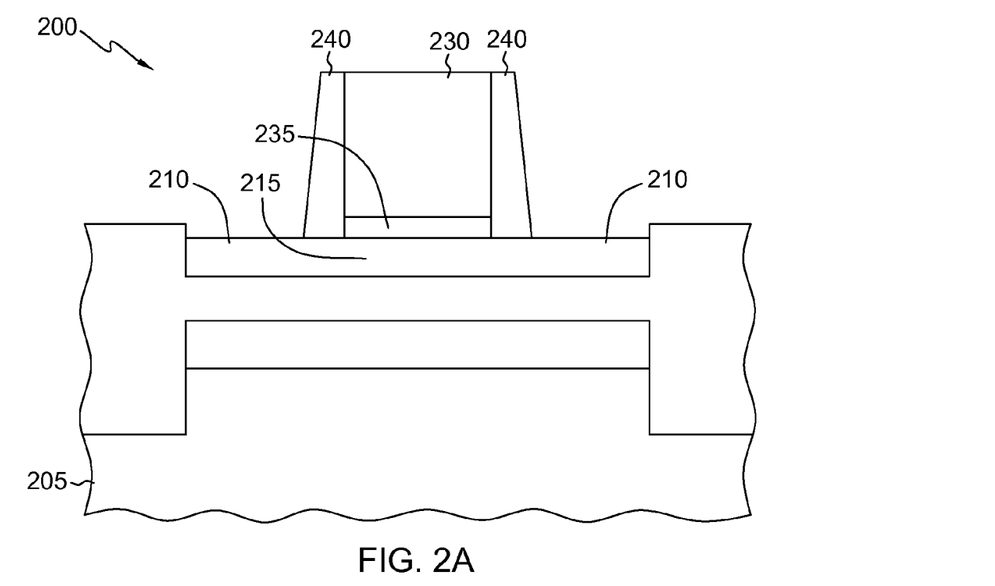
FIGS. 2A-2D depict one embodiment of a process for forming a doped transition region of a transistor structure, in accordance with one or more aspects of the present invention herein.

FIGS. 2A-2D illustrate one embodiment of a process for forming a doped transition region between a source/drain (S/D) region of a transistor structure and a channel region of the transistor structure. FIG. 2A depicts a structure 200 similar to structure 100 of FIG. 1A, including a substrate 205, a semiconductor layer that includes source/drain region 210 and channel region 215, and a gate structure that includes gate materials 230, 235 and sidewalls 240. Structure 200 may be obtained by any process, and may, for example, be formed by a process for forming silicon-on-insulator (SOI) circuit structures.

Figure 2B:
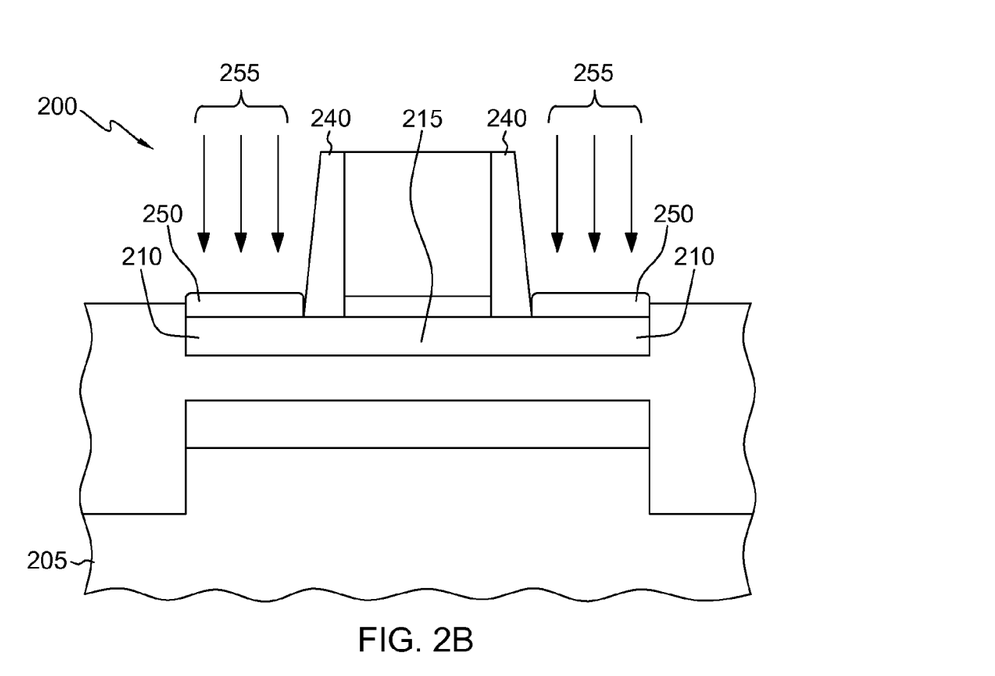

FIG. 2B depicts structure 200 of FIG. 2A undergoing provision of a first semiconductor material 250 over source/drain region 210. First semiconductor material 250 includes a dopant, such as boron, phosphorous, or another dopant material. First semiconductor material 250 may, in exemplary embodiments, include silicon. First semiconductor material 250 may be provided, in exemplary embodiments, via epitaxially growing 255 the first semiconductor material. Epitaxial growth 255 of first semiconductor material 250 may be carried out at a relatively low temperature, such as a temperature of about 500° C., to allow for growth of the first semiconductor material 250 without allowing diffusion of the dopant of the first semiconductor material 250 into source/drain region 210.

Figure 2C:
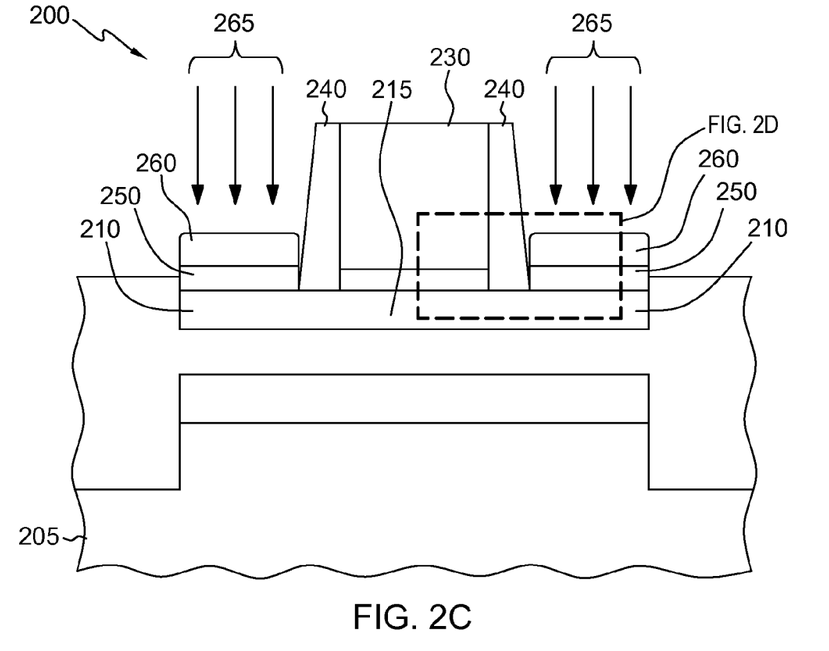
Figure 2D:
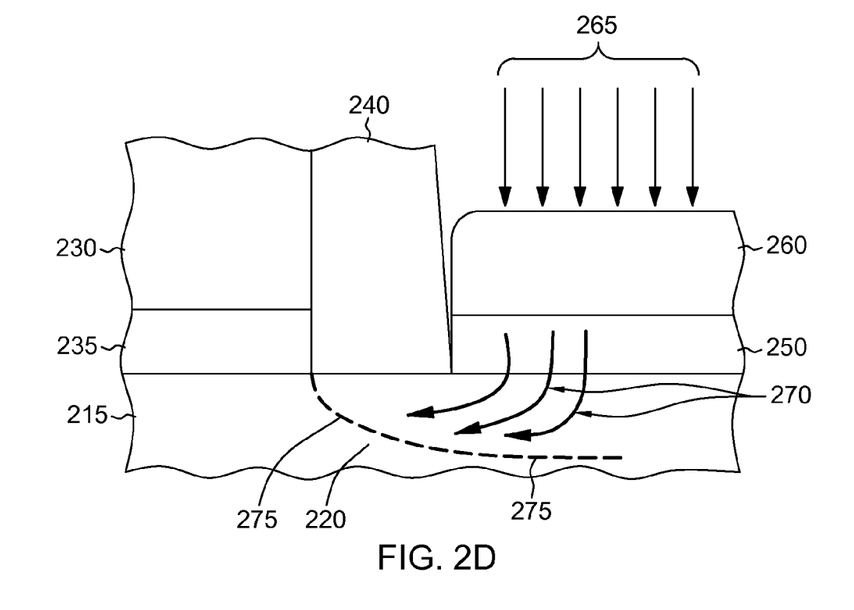

FIGS. 2C and 2D depict structure 200 of FIG. 2B undergoing provision 265 of a second semiconductor material 260 over first semiconductor material 250. FIG. 2D depicts a close-up view of a portion of structure 200 of FIG. 2C to better illustrate provision 265 of second semiconductor material 260. Second semiconductor material 260 includes the dopant, which may be the same type of dopant as the dopant of first semiconductor material 250. The provision 265 of second semiconductor material 260 is performed at a temperature that may sufficiently diffuse 270 the dopant from the first semiconductor material 250 through the source/drain region 210 into a portion 220 of a channel region 215 of the transistor structure. The portion 220 of the channel region 215 into which the dopant is diffused forms the doped transition region 220 of the transistor structure. The provision 265 of second semiconductor material 260 may be controlled to allow controllable diffusion of the dopant so that doped transition region 220 is formed at least partially beneath sidewalls 240 of the transistor structure, as illustrated by the edge 275 of doped transition region 220 in FIG. 2D. Controllably diffusing the dopant may also controllably diffuse the dopant so that the transition region 220 does not extend into the channel region 215 disposed beneath gate material 230, 235, as also illustrated by the edge 275 of doped transition region 220 in FIG. 2D.

Providing 265 second semiconductor material 260 may include, in exemplary embodiments, epitaxially growing second semiconductor material 260 over first semiconductor material 250. Epitaxial growth processes generally involve depositing the epitaxy material at temperatures sufficient to ensure growth of the material. The temperature of the epitaxy material may be sufficient to cause diffusion of dopant out of the first semiconductor material 250, and may be low enough to allow for controllable diffusion of the dopant so that the doped transition region 220 is formed at least partially beneath sidewalls 240. In exemplary embodiments, the diffusion of dopant may not extend into channel region 215 beyond sidewalls 240, as illustrated by the edge 275 of doped transition region 220 of FIG. 2D. For example, in embodiments in which the first semiconductor material 250 is silicon, silicon-germanium or silicon-carbon may be provided as the second semiconductor material 260, and either material may be epitaxially grown over silicon at temperatures ranging between about 500° C. and about 700° C. At such temperatures, p-type and n-type dopants, such as boron or phosphorous, may diffuse out of the silicon of first semiconductor material 250 at a relatively low diffusion rate due to the relatively low temperature of the epitaxy process used to form the second semiconductor material 260. In turn, the relatively low diffusion rate of the dopant out of first semiconductor material 260 may control the diffusion of dopant into the channel region 215 so that the doped transition region 220 extends far enough below sidewalls 240 to keep electrical resistance low, but without allowing doped transition region 220 to extend too far into channel region 215 below gate materials 230, 235 in order to minimize short-channel effects. In exemplary embodiments, dopant may diffuse to a dopant diffusion limit 275 as depicted in FIG. 2D, although it will be clear to those with skill in the art that dopant may extend less or more into channel region 215 while still achieving an ideal doped transition region.

A separate thermal treatment or annealing step, such as high-temperature annealing as illustrated in FIGS. 1A-1B, may be eliminated by the process embodied in FIGS. 2A-2D because the doped transition region 220 is formed using the dopant of the first semiconductor material 250 during epitaxy of the second semiconductor material 260, thus facilitating better control of the extent to which dopant diffuses into channel region 215 to create doped transition region 220. The process embodied in FIGS. 2A-2D may be used to form p-type transistors (PFETs) using p-type dopants in the first and second semiconductor materials, as well as to form n-type transistors (NFETs) using n-type dopants in the first and second semiconductor materials. As described further below, the process embodied by FIGS. 2A-2D may be applied to form doped transitions regions for both PFETs and NFETs of a circuit structure.

FIGS. 3A-3F depict one embodiment of a process for forming doped transition regions of two or more transistor structures. In the process illustrated by FIGS. 3A-3F, the transistor structure depicted in FIGS. 2A-2D may be considered a first transistor structure, the dopant may be a first dopant and the doped transition region may be considered a first doped transition region, and the source/drain region may be a first source/drain region and the channel region may be a first channel region. The process may further include forming a second doped transition region of a second transistor structure as further described below. It will be understood that the process illustrated by FIGS. 3A-3F may be extended to additional embodiments in which multiple doped transition regions of multiple transistor structures may be formed. The exemplary embodiment of the process depicted by FIGS. 3A-3F may result in formation of a doped transition region for a p-type transistor (PFET) and a doped transition region for an n-type transistor (NFET).

Figure 3A:
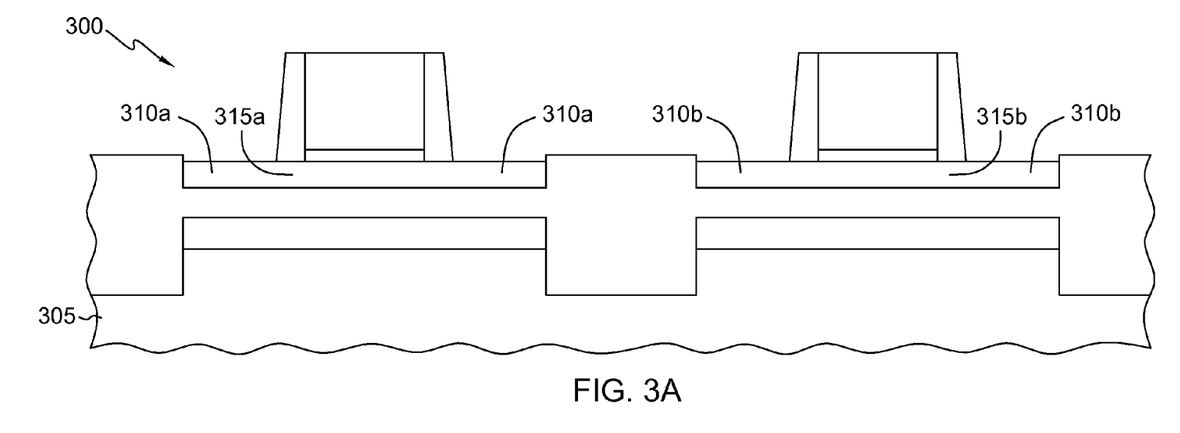
FIGS. 3A-3F depict one embodiment of a process for forming doped transition regions of two or more transistor structures, in accordance with one or more aspects of the present invention; and, FIGS. 4A-4E depict an alternative embodiment of a process for forming doped transition regions of two or more transistor structure, in accordance with one or more aspects of the present invention.

FIG. 3A depicts a structure 300 including multiple transistor structures over a substrate 305, similar to structure 200 of FIG. 2A. As depicted by FIG. 3A for example, a first transistor structure includes first source/drain region 310a and first channel region 315a, and a second transistor structure includes second source/drain region 310b and second channel region 315b. Source/drain regions 310a, 310b and channel regions 315a, 315b may include a semiconductor material such as silicon, germanium, or silicon-germanium (SiGe).

Figure 3B:
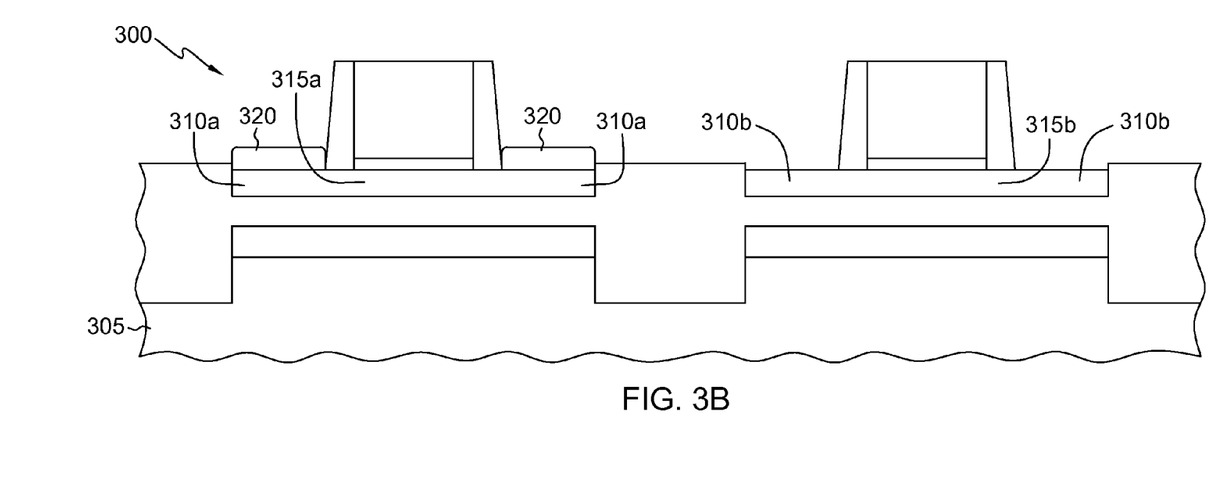

FIG. 3B depicts structure 300 of FIG. 3A following provision of first semiconductor material 320 over first source/drain region 310a. First semiconductor material 320 may be silicon, for example, and includes a first dopant. In the exemplary embodiment illustrated, the first dopant is a p-type dopant such as boron. First semiconductor material 320 may be provided, in exemplary embodiments, by epitaxial growth of first semiconductor material 320. During provision of first semiconductor material 320 over source/drain region 310a, source/drain region 310b may be protected to prevent deposition of the first semiconductor material over source/drain region 310b, for instance by providing a patterned resist layer and/or a hard mask layer, such as SiN, over source/drain region 310b.

Figure 3C:
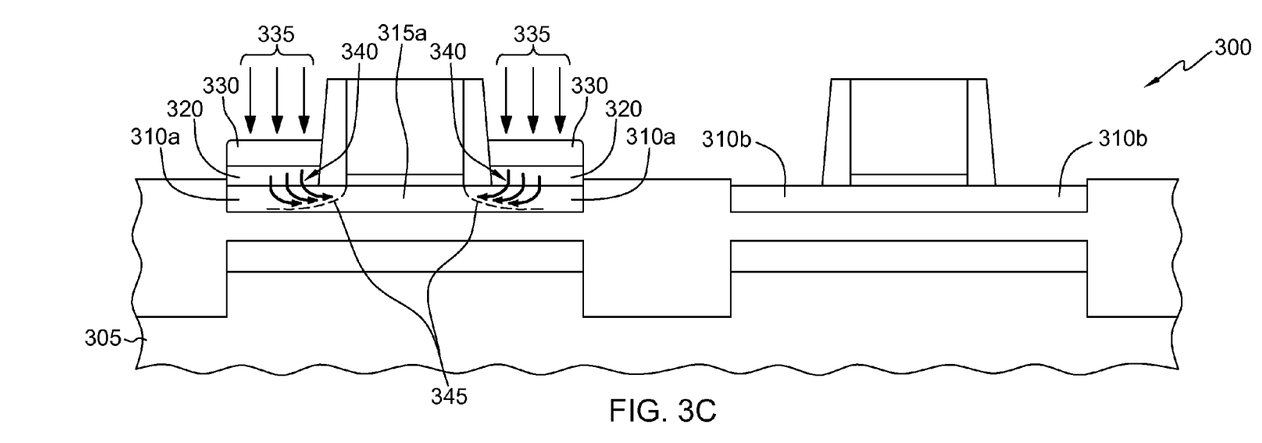

FIG. 3C depicts structure 300 of FIG. 3B during provision 335 of second semiconductor material 330 over first semiconductor material 320. Similar to the exemplary process illustrated by FIGS. 2C-2D, provision 335 of second semiconductor material 330 may be performed at a temperature sufficient to diffuse 340 the first dopant from first semiconductor material 320 through source/drain region 310a into a portion 345 of channel region 315a. By way of example, second semiconductor material 330 may be silicon-germanium provided by epitaxially growing 335 the silicon-germanium over first semiconductor material 320. In exemplary embodiments, silicon-germanium may include a p-type dopant, such as boron, as the first dopant. The epitaxial growth 335 of second semiconductor material 330 may be performed, for example, at a temperature between about 500° C. and about 700° C., which may be sufficient to diffuse 340 the first dopant from first semiconductor material 320 through first source/drain region 310a and into the portion 345 of first channel region 315a. During provision 335 of second semiconductor material 330, source/drain region 310b may be protected to prevent deposition of the first semiconductor material over source/drain region 310b.

The temperature at which provision of second semiconductor material 330 is performed may be controlled to fully diffuse dopant from first semiconductor material 320 to a desired diffusion depth, or alternatively may be controlled to partially diffuse dopant from first semiconductor material 320 into the portion 345 of the channel region. Partial diffusion of dopant from first semiconductor material 320 may be desirable if, for example, subsequent processing of structure 300 may include processes performed at temperatures that may cause further diffusion of dopant from first semiconductor material 320 into the portion 345 of channel region 315a, so that following subsequent processing the first doped transition region 345 extends far enough into first channel region 315a to overcome electrical resistance without extending so far into first channel region 315a that short-channel effects degrade performance of the transistor structure.

Figure 3D:
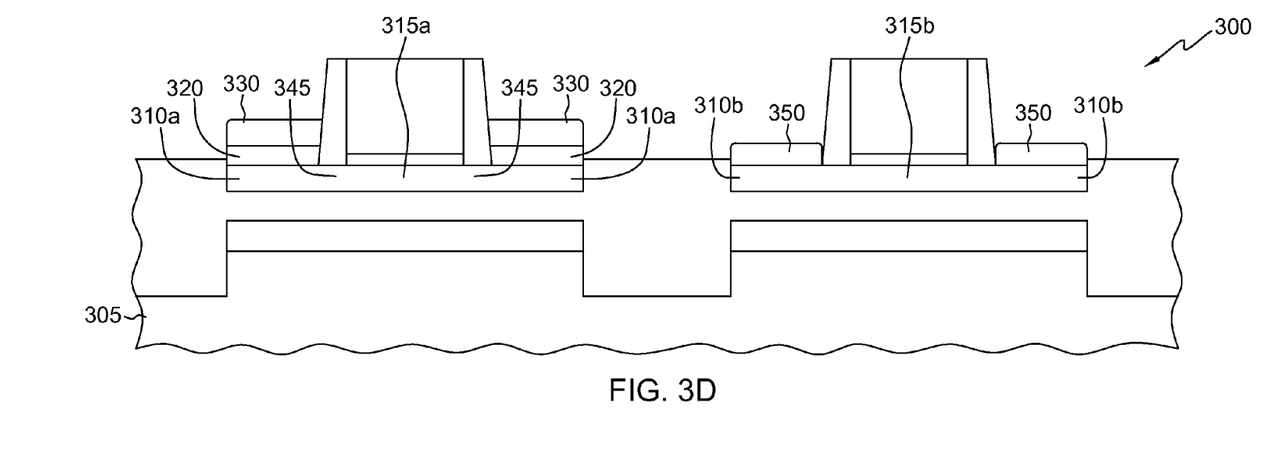

FIG. 3D depicts structure 300 of FIG. 3C following provision of a third semiconductor material 350 over second source/drain region 310b. Third semiconductor material 350 may be silicon, for example, and third semiconductor material 350 includes a second dopant. In the exemplary embodiment illustrated, the second dopant is an n-type dopant such as phosphorous. Third semiconductor material 350 may be provided, in exemplary embodiments, by epitaxial growth of third semiconductor material 350 over source/drain region 310b. During provision of third semiconductor material 350 over source/drain region 310b, source/drain region 310a, first semiconductor material 320, and second semiconductor material 330 may be protected to prevent deposition of the third semiconductor material, for instance by providing a patterned resist and/or a hard mask layer, such as SiN, over at least second semiconductor material 330.

Figure 3E:
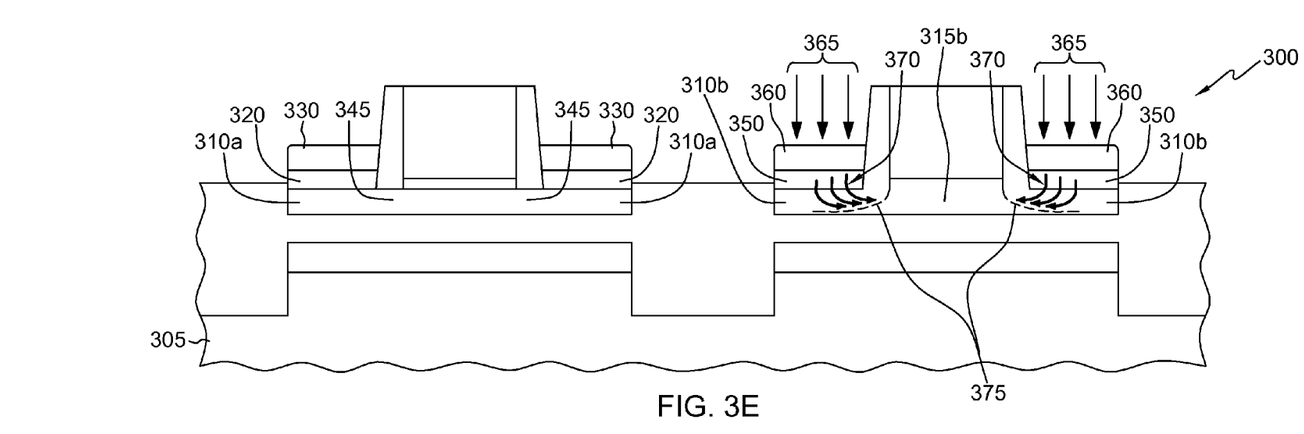

FIG. 3E depicts structure 300 of FIG. 3D during provision 365 of a fourth semiconductor material 360 over third semiconductor material 350. Similar to the exemplary process illustrated by FIGS. 2C-2D, provision 365 of fourth semiconductor material 360 may be performed at a temperature sufficient to diffuse 370 dopant from third semiconductor material 350 through source/drain region 310b into a portion 375 of channel region 315b. By way of example, fourth semiconductor material 360 may be silicon-carbon provided by epitaxially growing 365 the silicon-carbide over third semiconductor material 350. In exemplary embodiments, silicon-carbon may include an n-type dopant, such as phosphorous, as the second dopant. The epitaxial growth 365 of fourth semiconductor material 360 may be performed, for example, at a temperature between about 500° C. and about 700° C., which may be sufficient to diffuse 370 the second dopant from third semiconductor material 350 through source/drain region 310b and into the portion 375 of channel region 315b. During provision 365 of fourth semiconductor material 360, source/drain region 310a, first semiconductor material 320, and second semiconductor material 330 may be protected to prevent deposition of the fourth semiconductor material.

The temperature at which provision of fourth semiconductor material 360 is performed may be controlled to fully diffuse dopant from third semiconductor material 350 to a desired diffusion depth, or alternatively may be controlled to partially diffuse dopant from third semiconductor material 350 into the portion 375 of the channel region. Partial diffusion of dopant from first semiconductor material 350 may be desirable if, for example, subsequent processing of structure 300 may include processes performed at temperatures that may cause further diffusion of dopant from first semiconductor material 350 into the portion 375 of channel region 315b, so that following subsequent processing the doped transition region 375 extends far enough into channel region 315b to overcome electrical resistance without extending into channel region 315b to cause short-channel effects that may degrade performance of the transistor structure.

Additionally, in one example, the temperature at which provision of fourth semiconductor material 360 is performed may be controlled to prevent additional diffusion of first dopant from first semiconductor material 320 further into channel region 315a, as depicted in FIG. 3E. Alternatively, the temperature at which provision of fourth semiconductor material 360 is performed may be controlled to allow additional controlled diffusion of first dopant from first semiconductor material 320 into channel region 315a, in order to, for example, fully form first doped transition region 345. It will be understood by those with skill in the art that the temperature at which fourth semiconductor material is provided may be dependent on several factors, such as the semiconductor materials selected for the second semiconductor material and the fourth semiconductor material, the specific dopants chosen for the first dopant and second dopant, and so forth.

Figure 3F:
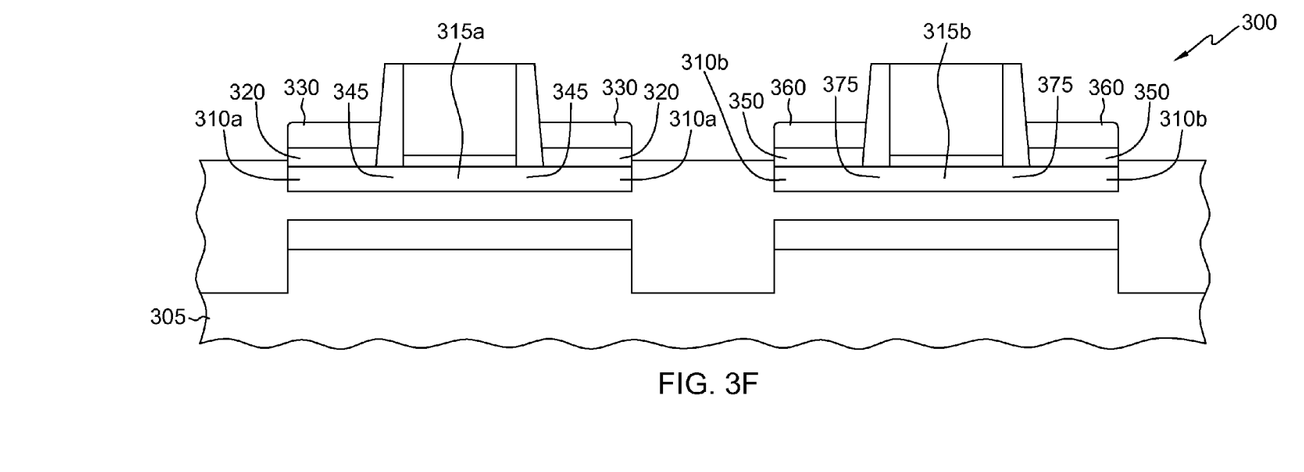

FIG. 3F depicts structure 300 following the process of FIGS. 3A-3E. Structure 300 includes a first transistor structure, which may be a p-type transistor, with first doped transition region 345 and a second transistor structure, which may be an n-type transistor, with second doped transition region 375. As a result of the process described above, first doped transition region 345 and second doped transition region 375 may sufficiently extend from source/drain region 310a and 310b, respectively, to channel region 315a and 315b, respectively, to reduce electrical resistance, and may also not extend into channel regions 315a and 315b so as to increase short-channel effects that may degrade transistor performance.

FIGS. 4A-4E depict an alternative embodiment of the process illustrated in FIGS. 3A-3F. In FIGS. 4A-4E, the transistor structure of FIGS. 2A-2D may be a first transistor structure, the dopant may be a first dopant and the doped transition region may be considered a first doped transition region, and the source/drain region may be a first source/drain region and the channel region may be a first channel region. In the alternative embodiment of FIGS. 4A-4E, prior to providing the first semiconductor material and second semiconductor material, a third semiconductor material including a second dopant is provided over the second source/drain region, and the second dopant is diffused through the second source/drain region into the second channel region during provision of the second semiconductor material over the first semiconductor material. It will be understood that the process illustrated by FIGS. 4A-4E may be extended to additional embodiments in which multiple doped transition regions of multiple transistor structures may be formed. The exemplary embodiment of the process depicted by FIGS. 4A-4E may result in formation of a doped transition region for a p-type transistor (PFET) and a doped transition region for an n-type transistor (NFET).

Figure 4A:
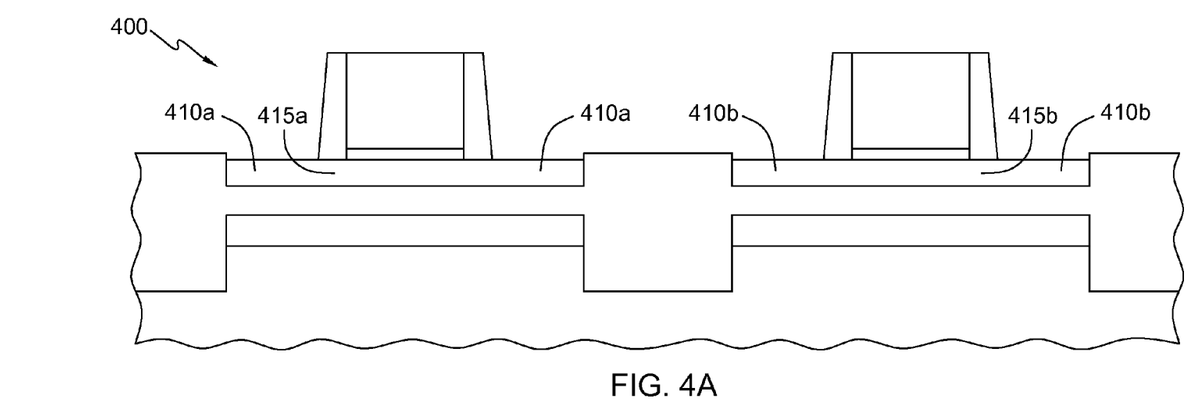

FIG. 4A depicts a structure 400 including multiple transistor structures over a substrate 405, similar to structure 300 of FIG. 3A or structure 200 of FIG. 2A. As depicted by FIG. 4A for example, a first transistor structure includes first source/drain region 410a and first channel region 415a, and a second transistor structure includes second source/drain region 410b and second channel region 415b. Source/drain regions 410a, 410b and channel regions 415a, 415b may include a semiconductor material such as silicon.

Figure 4B:
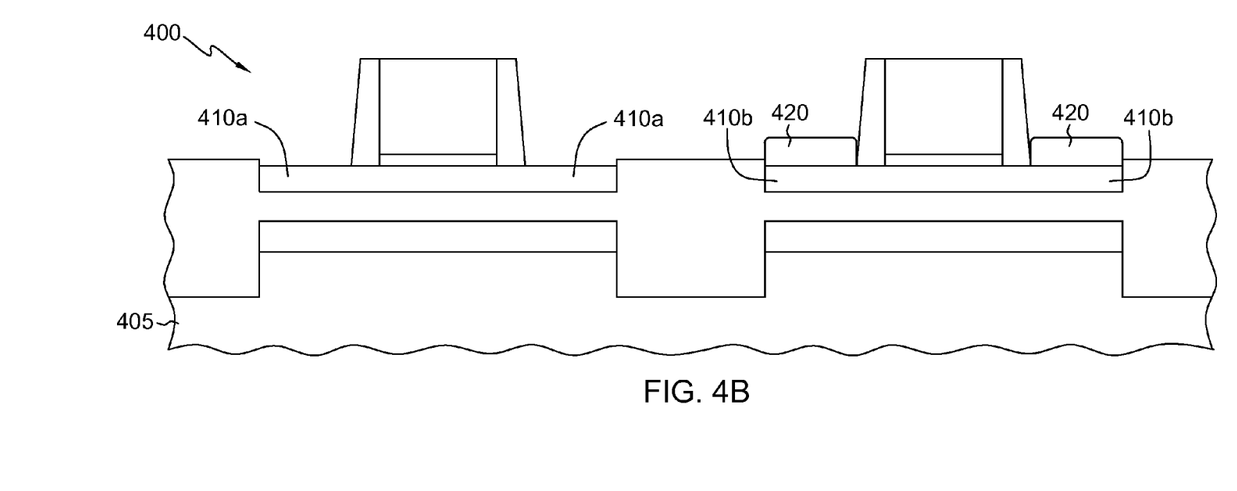

FIG. 4B depicts structure 400 of FIG. 4A following provision of third semiconductor material 420 including the second dopant over second source/drain region 410b, prior to providing first semiconductor material 430 and second semiconductor material 440 over first source/drain region 410a, as described further below. By way of example, third semiconductor material 420 may be silicon-carbon provided by epitaxially growing the silicon-carbide over source/drain region 410b. In exemplary embodiments, the third semiconductor material 420 may include an n-type dopant, such as phosphorous, as the second dopant. Epitaxial growth of third semiconductor material 420 may be performed, for example, at a temperature between about 500° C. and about 700° C. During provision of third semiconductor material 420 over source/drain region 410b, source/drain region 410a may be protected to prevent deposition of the third semiconductor material, for instance by providing a patterned resist and/or a hard mask layer, such as SiN, over source/drain region 410a.

Figure 4C:
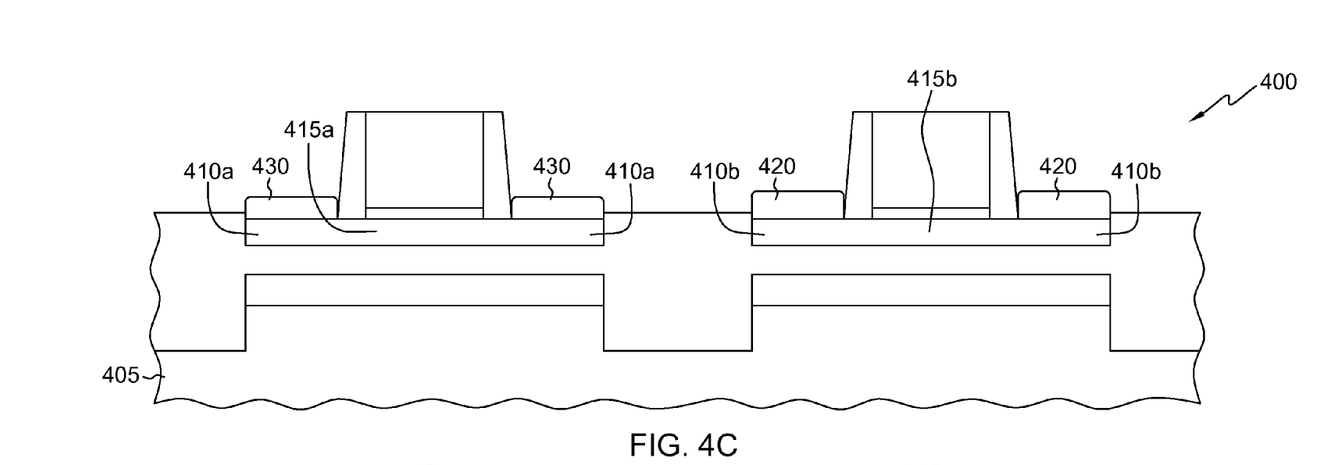

FIG. 4C depicts structure 400 of FIG. 4B following provision of the first semiconductor material 430 including the first dopant over first source/drain region 410a. By way of example, first semiconductor material 430 may be silicon, and may be provided by epitaxially growing the first semiconductor material 430 over first source/drain region 410a. In exemplary embodiments, first semiconductor material 430 may include a p-type dopant, such as boron, as the first dopant. Epitaxial growth of first semiconductor material 430 may be performed, for example, at a temperature between about 500° C. and about 700° C. The temperature at which first semiconductor material 430 is provided may be controlled so that the second dopant of third semiconductor material 420 does not diffuse out of the third semiconductor material. For example, if third semiconductor material 420 is silicon-carbon and the second dopant is phosphorous, epitaxial growth of boron-doped silicon 430 at a temperature below about 700° C. may allow for epitaxial growth of the boron-doped silicon 430 without allowing diffusion of the phosphorous out of the silicon-carbon 420. During provision of first semiconductor material 430 over source/drain region 410a, third semiconductor material 420 may be protected to prevent deposition of the first semiconductor material 430 over the third semiconductor material 420, for instance by providing a patterned resist layer and/or a hard mask layer, such as SiN, over third semiconductor material 420.

Figure 4D:
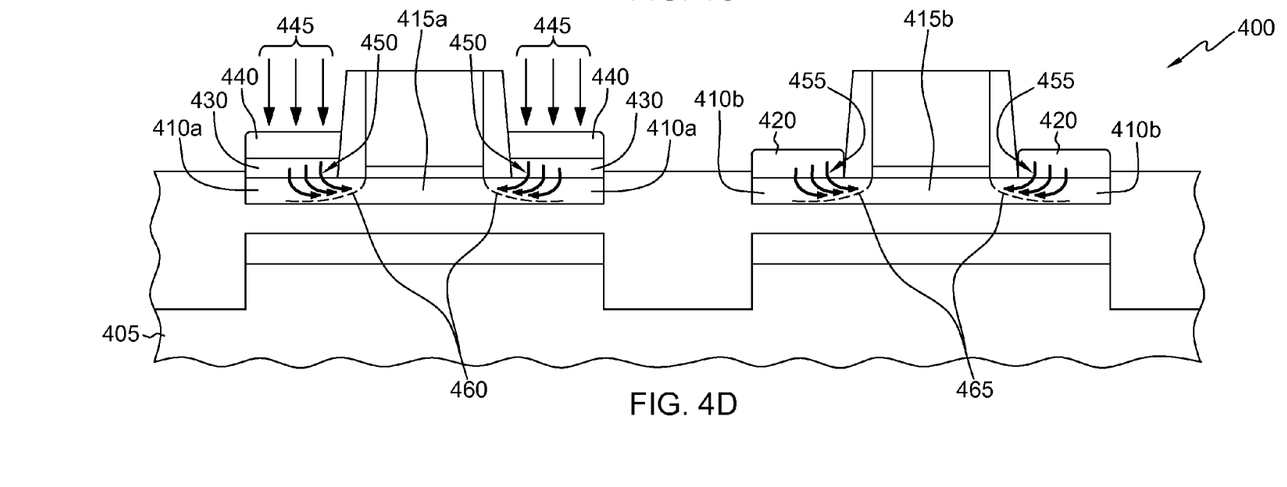

FIG. 4D depicts structure 400 of FIG. 4C during provision 445 of second semiconductor material 440 over first semiconductor material 430. Similar to the exemplary process illustrated by FIGS. 2C-2D, provision 445 of second semiconductor material 440 may be performed at a temperature sufficient to diffuse 450 the first dopant from first semiconductor material 430 through first source/drain region 410a into a portion 460 of first channel region 415a. Additionally, the temperature at which provision 445 of second semiconductor material 440 is performed may be sufficient to diffuse 455 the second dopant from third semiconductor material 420 through second source/drain region 410b into a portion 465 of second channel region 415b. By way of example, second semiconductor material 440 may be silicon-germanium provided by epitaxially growing 445 the silicon-germanium over first semiconductor material 430. In exemplary embodiments, second semiconductor material 440 may include a p-type dopant, such as boron, as the first dopant. The epitaxial growth 445 of second semiconductor material 440 may be performed, for example, at a temperature above about 700° C., which may be sufficient to diffuse 450 the first dopant from first semiconductor material 430, and may be sufficient to diffuse 455 the second dopant from third semiconductor material 420. During provision 445 of second semiconductor material 440, third semiconductor material 420 may be protected to prevent deposition of the second semiconductor material over third semiconductor material 420, for instance by providing a patterned resist layer and/or a hard mask layer, such as SiN, over third semiconductor material 420.

Figure 4E:
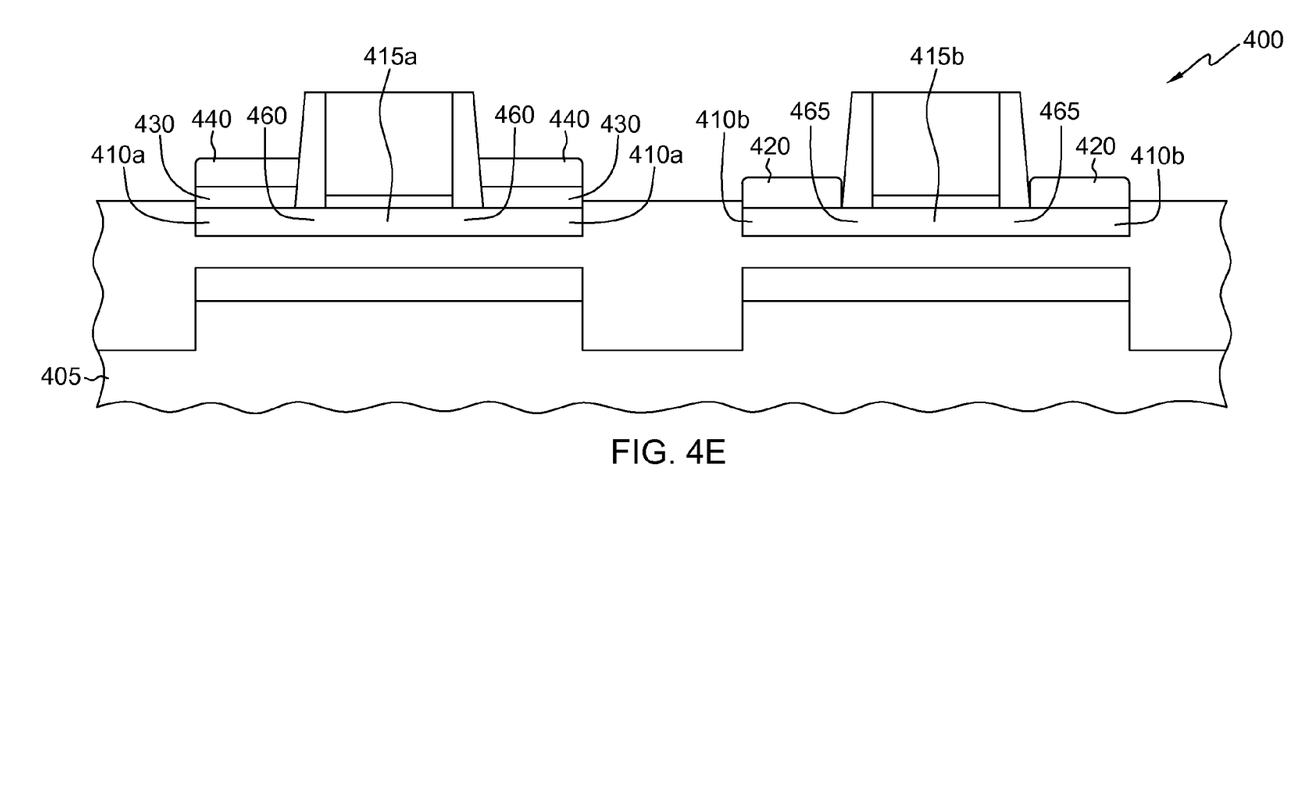

FIG. 4E depicts structure 400 following the process of FIGS. 4A-4D. Structure 400 includes a first transistor structure, which may be a p-type transistor, with first doped transition region 460 and a second transistor structure, which may be an n-type transistor, with second doped transition region 465. As a result of the process described above, first doped transition region 460 and second doped transition region 465 may sufficiently extend from source/drain region 410a and 410b, respectively, to channel region 415a and 415b, respectively, to reduce electrical resistance, and may also not extend into channel regions 415a and 415b so as to increase short-channel effects that may degrade transistor performance.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:

1. A method comprising:
   forming a doped transition region between a source/drain region of a transistor structure and a channel region of the transistor structure, the forming comprising:
   providing a first semiconductor material comprising a dopant over the source/drain region;
   providing a second semiconductor material comprising the dopant over the first semiconductor material, the second semiconductor material being different from the first semiconductor material;
   wherein providing the second semiconductor material is performed at a temperature sufficient to diffuse the dopant from the first semiconductor material through the source/drain region into the doped transition region;
   wherein providing the second semiconductor material further comprises controllably diffusing the dopant so that the doped transition region is formed at least partially beneath one or more sidewalls of a gate structure and wherein the doped transition region does not extend into the channel region disposed beneath the gate of the gate structure;

wherein the transistor structure is a first transistor structure, the dopant is a first dopant, the doped transition region is a first doped transition region, the source/drain region is a first source/drain region and the channel region is a first channel region, and the method further comprises forming a second doped transition region of a second transistor structure, wherein forming the second doped transition region comprises:

providing a third semiconductor material comprising a second dopant over a second source/drain region of the second transistor structure;

providing a fourth semiconductor material comprising the second dopant over the third semiconductor material, the second semiconductor material being different from the third semiconductor material; and wherein providing the fourth semiconductor material is performed at a temperature sufficient to diffuse the second dopant from the third semiconductor material through the second source/drain region into the second doped transition region, and wherein the temperature sufficient to diffuse the second dopant from the third semiconductor material is insufficient to further diffuse the first dopant of the first transistor structure.

2. The method of claim 1, wherein providing the first semiconductor material comprises epitaxially growing the first semiconductor material.

3. The method of claim 1, wherein providing the second semiconductor material comprises epitaxially growing the second semiconductor material.

4. The method of claim 1, wherein the first semiconductor material comprises silicon, the second semiconductor material comprises silicon-germanium, and the dopant comprises a p-type dopant.

5. The method of claim 4, wherein the p-type dopant is boron.

6. The method of claim 1, wherein the first semiconductor material comprises silicon, the second semiconductor material comprises silicon-carbon, and the dopant comprises an n-type dopant.

7. The method of claim 6, wherein the n-type dopant is phosphorous.

8. The method of claim 1, wherein the third semiconductor material comprises silicon, the fourth semiconductor material comprises silicon-carbon, and the second dopant comprises an n-type dopant.

9. The method of claim 8, wherein the first semiconductor material comprises silicon, the second semiconductor material comprises silicon-germanium, and the first dopant comprises a p-type dopant.

10. The method of claim 9, wherein the p-type dopant is boron and the n-type dopant is phosphorous, and wherein the providing the fourth semiconductor material comprises epitaxially growing the fourth semiconductor material at a temperature between about 500° C. and 700° C.

11. The method of claim 1, wherein the transistor structure is a first transistor structure, the dopant is a first dopant, the doped transition region is a first doped transition region, the source/drain region is a first source/drain region and the channel region is a first channel region, and the method further comprises forming a second doped transition region of a second transistor structure, wherein forming the second doped transition region comprises:

providing, prior to providing the first semiconductor material and second semiconductor material, a third semiconductor material comprising a second dopant over a second source/drain region of the second transistor structure; and wherein the temperature of providing the second semiconductor material is further sufficient to diffuse the second dopant from the third semiconductor material through the second source/drain region into the second doped transition region.

12. The method of claim 11, wherein the third semiconductor material comprises silicon-carbon, and the second dopant comprises an n-type dopant.

13. The method of claim 12, wherein the first semiconductor material comprises silicon, the second semiconductor material comprises silicon-germanium, and the first dopant comprises a p-type dopant.

14. The method of claim 13, wherein the providing the second semiconductor material comprises epitaxially growing the second semiconductor material at a temperature between about 500° C. and 700° C.

\* \* \* \* \*